United States Patent [19]
Sirles et al.

[11] 3,878,553
[45] Apr. 15, 1975

[54] INTERDIGITATED MESA BEAM LEAD DIODE AND SERIES ARRAY THEREOF

[75] Inventors: Carl Wayne Sirles, Garland; Barry W. Battershall, Plano, both of Tex.

[73] Assignee: Texas Instruments Incorporated, Dallas, Tex.

[22] Filed: Dec. 26, 1972

[21] Appl. No.: 318,078

[52] U.S. Cl. ...................... 357/56; 357/55; 357/68; 357/69
[51] Int. Cl. ......................... H01l 11/00; H01l 15/00
[58] Field of Search .............. 317/234, 5.4, 255, 47, 317/47.1

[56] References Cited

UNITED STATES PATENTS

| | | | |
|---|---|---|---|
| 3,274,667 | 9/1966 | Siebertz | 317/235 AK |
| 3,304,595 | 2/1967 | Sato et al. | 317/235 AK |
| 3,445,303 | 5/1969 | Engbert | 317/235 AK |
| 3,483,096 | 12/1969 | Gri et al. | 317/235 AK |
| 3,525,910 | 8/1970 | Philips | 317/235 |
| 3,534,234 | 10/1970 | Clevenger | 317/235 AK |
| 3,594,619 | 7/1971 | Kamoshida | 317/234 M |
| 3,631,307 | 12/1971 | Naugler | 317/235 AK |
| 3,639,811 | 2/1972 | Schroeder | 317/234 N |
| 3,649,881 | 3/1972 | Chang et al | 317/234 J |
| 3,654,526 | 4/1972 | Cunningham et al | 317/234 |
| 3,659,160 | 4/1972 | Sloan et al. | 317/235 R |
| 3,685,141 | 8/1972 | Sandera | 317/235 AK |

*Primary Examiner*—Andrew J. James
*Attorney, Agent, or Firm*—Harold Levine; James T. Comfort; James O. Dixon

[57] ABSTRACT

This disclosure relates to a semiconductor device structure defining an inter-digitated P-N junction diode, wherein a plurality of raised protuberances forming elevated mesas are provided on a semiconductor substrate of one conductivity type. The mesas respectively include a semiconductor region of the other conductivity type forming the top portion thereof so as to define a plurality of parallel elongated fingers in spaced apart relation to each other of the conductivity type opposite from that of the substrate and the remaining portions of the mesas. The elongated fingers of the semiconductor region are interlaced alternately with surface portions of the substrate to define an interdigitaed arrangement therebetween. Electrically conductive contact members are respectively fixedly mounted on the fingers defining the semiconductor region of the other conductivity type and the surface of the substrate, with the electrically conductive contact members having respective configurations conforming to the elongated fingers of the semiconductor region and the surface portions of the substrate. Thus, the electrically conductive contact members provide an interdigitated arrangement between alternating contact fingers thereof, with each electrically conductive contact member including a web portion joining the contact fingers thereof and concluding in a conductor portion extending away from the interdigitaed arrangement. In a particular application, a plurality of such semiconductor devices are serially joined by the conductor portions of the electrically conductive contact members which define beam leads. Parasitic lead inductance is reduced by the beam leads and also by the interdigitated arrangement of the several P-N junctions. The structure provides a series diode array having particular application in microwave integrated circuits as a frequency multiplier for microwave frequencies in phased array radar modules.

5 Claims, 4 Drawing Figures

INTERDIGITATED MESA BEAM LEAD DIODE AND SERIES ARRAY THEREOF

This invention relates to a semiconductor device, and more particularly to an interdigitated P-N junction diode utilizing beam leads and including a plurality of mesas on a substrate of semiconductor material of one conductivity type, wherein the tops of the mesas provide respective fingers defining a semiconductor region of the other conductivity type. In a specific application, a plurality of such structures may be serially joined through the use of beam leads to define a beam-leaded, monolithic series diode array for use in microwave integrated circuits.

A frequency multiplier is commonly employed in conjunction with an oscillator in a microwave application where it is necessary to achieve microwave frequencies for providing RF energy in the high microwave region, such as from 5–35 GHz. A typical form of frequency multiplier so employed is a packaged semiconductor device structure including a stack of diode chips, with each diode chip including a single mesa thereon providing a P-N junction, the mesa being commonly of circular configuration. The plurality of diode chips are serially connected, such as by jumper wires, and provide frequency multiplication. However, this type of structure tends to be bulky and further is subject to parasitic lead inductance which downgrades its operating performance. Furthermore, the high power dissipation associated with the operation of a frequency multiplier offers the additional problem of how to successfully dissipate heat by substantially reducing the thermal resistance of the device.

Other operating difficulties commonly encountered with frequency multipliers comprising serially connected semiconductor diode devices of known construction have included problems of achieving breakdown voltages in the diode devices of sufficiently high magnitudes to prevent severe power limitations in the use of the frequency multiplier, and also inferior RF performance due to electrical parasitics and higher than desirable RF series resistance.

The present invention is directed to a semiconductor device comprising a P-N junction diode, a plurality of which may be connected in series to provide a frequency multiplier having particular application in microwave integrated circuits and offering improved operating characteristics over such structures heretofore employed for this purpose. To this end, each diode in the series array is formed by a substrate of semiconductor material of one conductivity type on which a plurality of spaced apart mesas are provided. The tops of the respective mesas define fingers of a semiconductor region of the other conductivity type, these fingers being interlaced with surface portions of the substrate to define an interdigitated arrangement therewith of respectively alternating fingers and surface portions. Respective beam leads forming first and second electrically conductive contact members are fixedly mounted on the plurality of fingers comprising the semiconductor region and on the surface portions of the substrate. The electrically conductive contact members are so shaped as to conform to the elongated fingers of the semiconductor region and the surface portions of the substrate interlaced therebetween such that each electrically conductive contact member includes a plurality of elongated contact fingers arranged in alternating relationship so as to provide an interdigitated arrangement therebetween. The respective contact fingers of each electrically conductive contact member are interconnected by a web portion of the contact member which itself is integrally joined to a conductor portion extending away from the interdigitated contact arrangement.

A plurality of such diode structures are serially connected to provide an improved frequency multiplier having special applicability in integrated circuits intended for use at microwave frequencies. One particular application is in phased array radar modules where a frequency multiplier is so constructed to be used in conjunction with a solid-state transistor oscillator to provide RF energy in the high microwave region, as for example, 5–35 GHz.

The improved construction comprises a beam-leaded, monolithic series diode array of small physical size having a high breakdown voltage to enable high power to be handled and of reduced parasitic electrical inductance. In another aspect of the invention, one of the electrically conductive contact members of each diode in the serially connected array may include expanded wing portions at the opposite ends thereof to provide heat conduction zones for dissipating heat from the interdigitated P-N junctions included in the array.

The objects, features and advantages of the invention will be more apparent from the following detailed description when taken in connection with the drawings in which.

Figure 1:
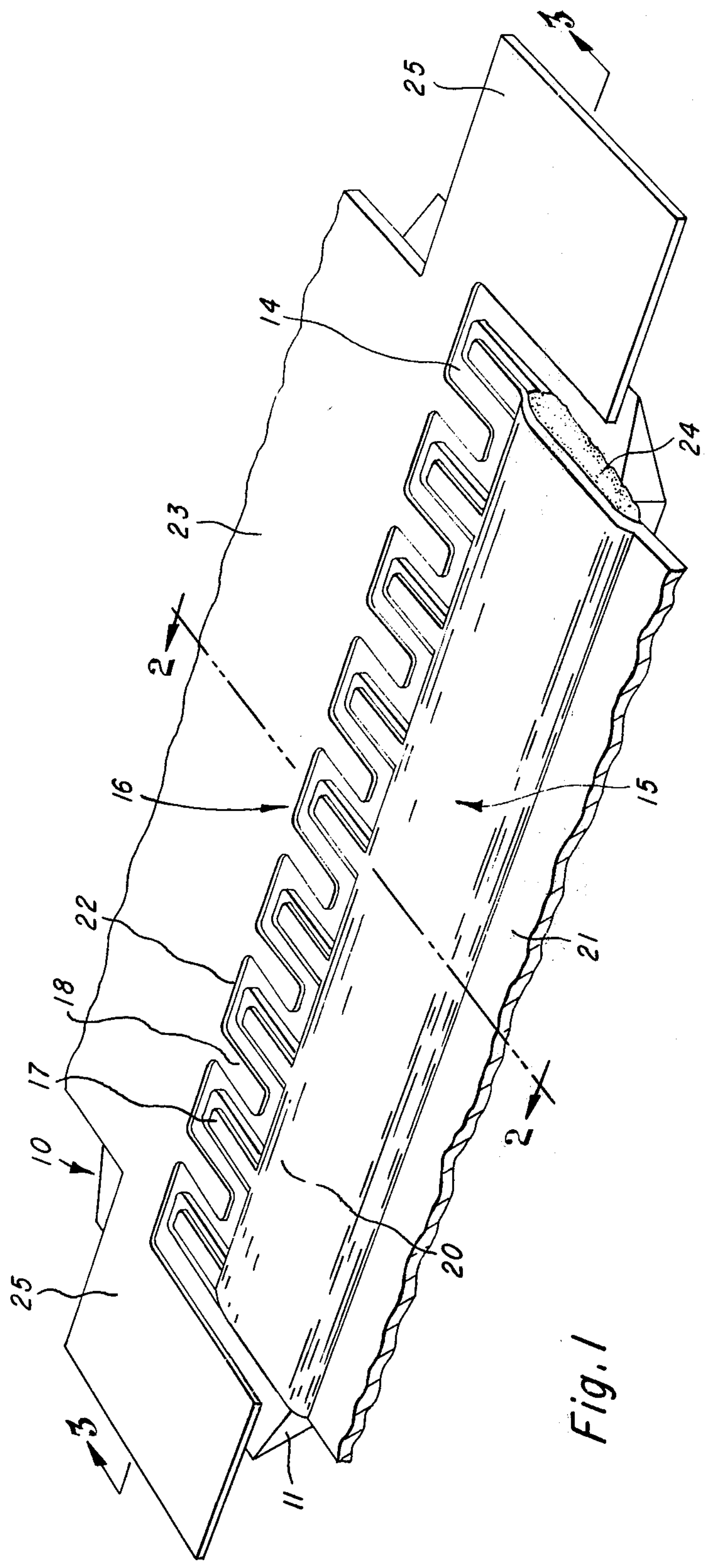
FIG. 1 is a perspective view of a single interdigitated P-N junction mesa diode in accordance with the present invention.

Referring more specifically to the drawings, FIG. 1 illustrates a semiconductor device 10 in the form of a diode structure constructed in accordance with the present invention. The semiconductor device 10 comprises a substrate or chip 11 of semiconductor material of one conductivity type. The upper surface of the substrate 11 is provided with a plurality of parallel elongated raised protuberances elevated above the surface thereof and defining a plurality of mesas 12. These mesas 12 may be formed in any suitable manner, such as by depositing an epitaxial layer on the substrate 11 of the same conductivity type semiconductor material, and thereafter chemically etching the epitaxial layer in a selective manner as determined by a masking pattern to form the individual mesas 12 of epitaxial material.

The substrate 11 and the individual mesas 12 provided thereon are preferably formed of silicon, although other semiconductor materials may also be used. The substrate 11 and mesas 12 are of the same conductivity type semiconductor material but of differing resistivity, the substrate 11 preferably being of low resistivity as compared to the resistivity of the mesas 12. An interrupted semiconductor region of the other conductivity type is provided on the substrate 11, this semiconductor region being defined by a plurality of parallel elongated fingers 13 respectively forming the top portions of the individual mesas 12 and defining therewith respective sections of a P-N junction. In the latter connection, the fingers 13 included in the semiconductor region of the other conductivity type are preferably of P+ conductivity, being formed by the introduction of a suitable acceptor material, such as by diffusion, ion implantation or other comparable technique, into the top portion of the epitaxial layer of N conductivity which is then etched in forming the mesas 12 and the fingers 13 as the top portions thereof.

An insulating layer 14 is further provided, the insulating layer 14 being disposed on the upper surface of the substrate 11 and also covering the sides and tops of the respective mesas 12 provided thereon. The insulating layer 14 is preferably silicon dioxide and is patterned to include a plurality of openings therethrough exposing surface portions of the substrate 11 and the fingers 13 included in the semiconductor region of the other conductivity type and forming the top portions of the mesas 12. Thus, the semiconductor device 10 includes a plurality of parallel elongated surface portions on the substrate 11 at a first lower level interlaced with parallel elongated fingers 13 of the semiconductor region forming the top portions of the mesas 12 at a second level elevated above the first substrate surface level in an interdigitated arrangement of respectively alternating elevated fingers 13 and surface portions of the substrate 11 exposed through openings in the insulating layer 14.

Figure 3:
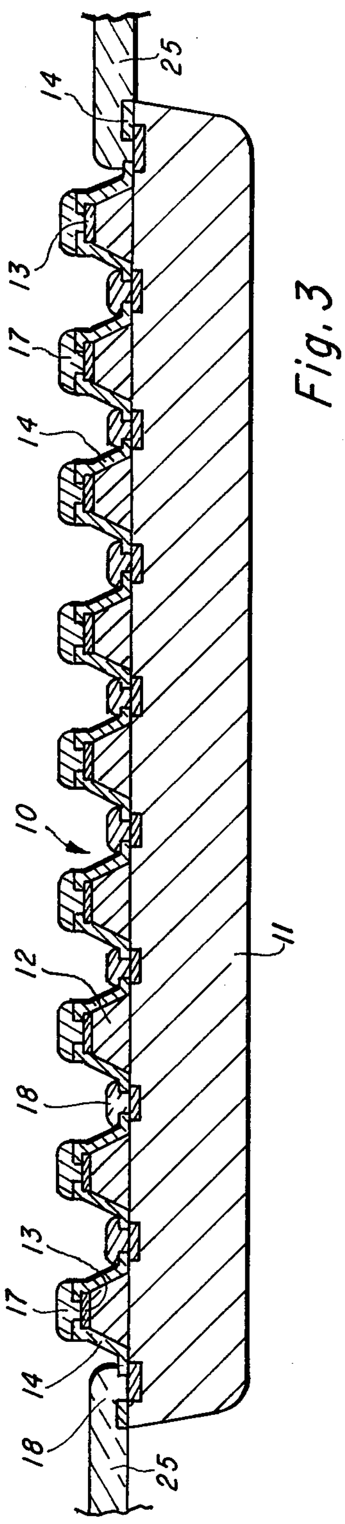
FIG. 3 is a transverse sectional view taken along the line 3—3 of FIG. 1.

The semiconductor device 10 further includes first and second electrically conductive contact members 15 and 16 in the form of respective metallized layers fixedly mounted on the elongated fingers 13 of the semiconductor region and the surface portions of the substrate 11 and comprising beam leads. The first and second contact members 15 and 16 are respectively shaped so as to conform to the elongated fingers 13 of the semiconductor region and the surface portions of the substrate 11, thereby defining alternating contact fingers 17 and 18 providing an interdigitated arrangement therebetween. Referring to FIG. 3, it will be observed that the respective contact fingers 17, 18 are applied to the top portions 13 of the mesas 12 and the surface portions of the substrate 10 so as to extend through the openings in the insulating layer 14 into an electrical contact with the elongated fingers 13 of the semiconductor region and the surface portions of the substrate 11, respectively. As shown, the surface portions of the substrate 11 engaged by the contact member 16 and the fingers 18 thereof may be appropriately doped by an impurity to further lower the resistivity thereof, thereby providing ohmic contact enhancement zones of the same conductivity as the substrate 11 but of lower resistivity. The spaced apart contact fingers 17 of the first electrically conductive contact member 15 are interconnected by a bridging web portion 20 (FIG. 1) which itself is integrally joined to a conductor portion 21 of the contact member 15, the conductor portion 21 extending away from the interdigitated arranagement of the first and second electrically conductive contact members 15 and 16. The second electrically conductive contact member 16 similarly includes a web portion 22 interconnecting the spaced contact fingers 18 thereof, the web portion 22 being integrally joined to a conductor portion 23 of the contact member 16 extending away from the interdigitated arrangement of the first and second electrically conductive contact members 15 and 16.

As so constructed, the semiconductor device 10 includes a plurality of elevated contact fingers 17 in the interdigitated relationship with a plurality of contact fingers 18 disposed on the surface of the substrate 11. Suitable support means are provided for the web portion 20 integrally associated with the elevated contact fingers 17 of the electrically conductive contact member 15 and the adjoining conductor portion 21. To this end, a mass of insulating material 24 is interposed between the insulating layer 14 on the surface of the substrate 11 adjacent the plurality of raised mesas 12 to provide support for the web portion 20. Any suitable insulating material may be employed as the supporting mass 24 for the web portion 20 and the conductor portion 21 of the contact member 15. A preferred insulating mass may be formed from a mixture of photoresist KMER and glass which is fused together and disposed on the substrate 11 to form a bridging support for the web portion 20 and the conductor portion 21 of the contact member 15. Such a supporting arrangement for the elevated portion of the contact member 15 protects it from breaking by providing a smooth transition between the first lower level at the surface of the substrate 11 and the second elevated level at the tops of the mesas 12.

The second electrically conductive contact member 16 further includes expanded wing portions 25, 25 at the opposite ends thereof to provide heat conductive zones for facilitating the dissipation of heat from the interdigitated P-N junction diode arrangement.

It will therefore be seen that the semiconductor device 10 as so constructed comprises as interdigitated P-N junction mesa diode employing beam leads 15 and 16, wherein the device 10 may be directly bonded onto an integrated circuit without utilizing external packaging. The beam lead construction enables the semiconductor device 10 to be of relatively compact size and aids in limiting parasitic lead inductance to a uniformly minimal level.

In one particular embodiment of an interdigitated mesa diode 10 constructed in accordance with this invention, the substrate 11 was made of silicon doped with arsenic such that the substrate 11 was of N+ conductivity having a resistivity lying in the range of 0.001–0.003 ohm-cm. The mesas 12 were formed from an epitaxial silicon layer doped with arsenic to produce N conductivity and having a resistivity in excess of 5 ohm-cm. The elongated fingers 13 forming the semiconductor region of the other conductivity type at the top of the mesas 12 were of P+ conductivity, being produced by the diffusion of boron into the N type epitaxial silicon mesas 12, wherein the doping level of the boron was maintained at $5 \times 10^{20}$ atoms/$cm^3$. The first and second electrically conductive contact members 15 and 16 comprising the beam leads for the diode structure 10 were formed by vapor deposition of gold followed by the additional plating of gold over the base layer of evaporated gold to provide a thickness of approximately 0.3 mil for the respective first and second electrically conductive contact members 15 and 16. The layer thickness of the boron diffusion forming the elongated fingers 13 of the semiconductor region of P+ conductivity was of the order of 0.04 mil, while the junction area of the interdigitated P-N junction diode was of the order of 40 $mils^2$, thereby achieving a capacitance of approximately 1.7 pf with a reverse breakdown voltage of the order of 50 volts for the diode device 10.

Figure 2:
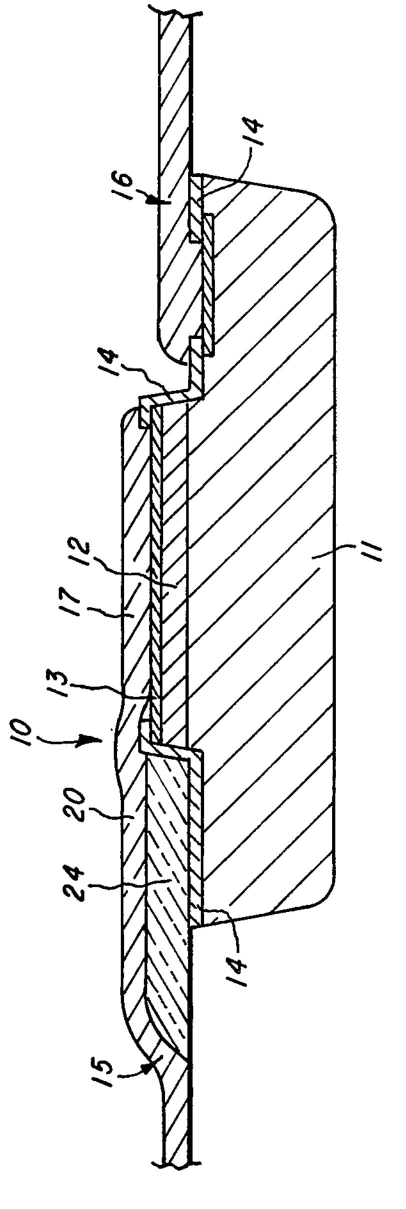
FIG. 2 is a longitudinal sectional view taken along the line 2—2 of FIG. 1.

The interdigitated arrangement of the P-N junction of the semiconductor device 10 provides for enhanced electrical current flow and heat dissipation, the heat dissipation being further aided by the expanded wing portions 25, 25 at the opposite ends of the electrically conductive contact member 16. The beam-leaded form of the semiconductor device 10 adapts the device for microstrip application, with the fused KMER-glass mass 24 providing a support for the beam lead comprising the electrically conductive contact member 15 which extends onto the tops 13 of the mesas 12 into electrical contact with the P+ conductivity elongated fingers 13 of the semiconductor region provided on the mesas 12. Referring to FIG. 2, it will be observed that the electrically conductive contact member 16 is in engagement with the N+ conductivity substrate 11 through appropriate openings provided in the insulating layer 14 overlying the substrate 11 and forming the sidewalls of the mesas 12.

Figure 4:
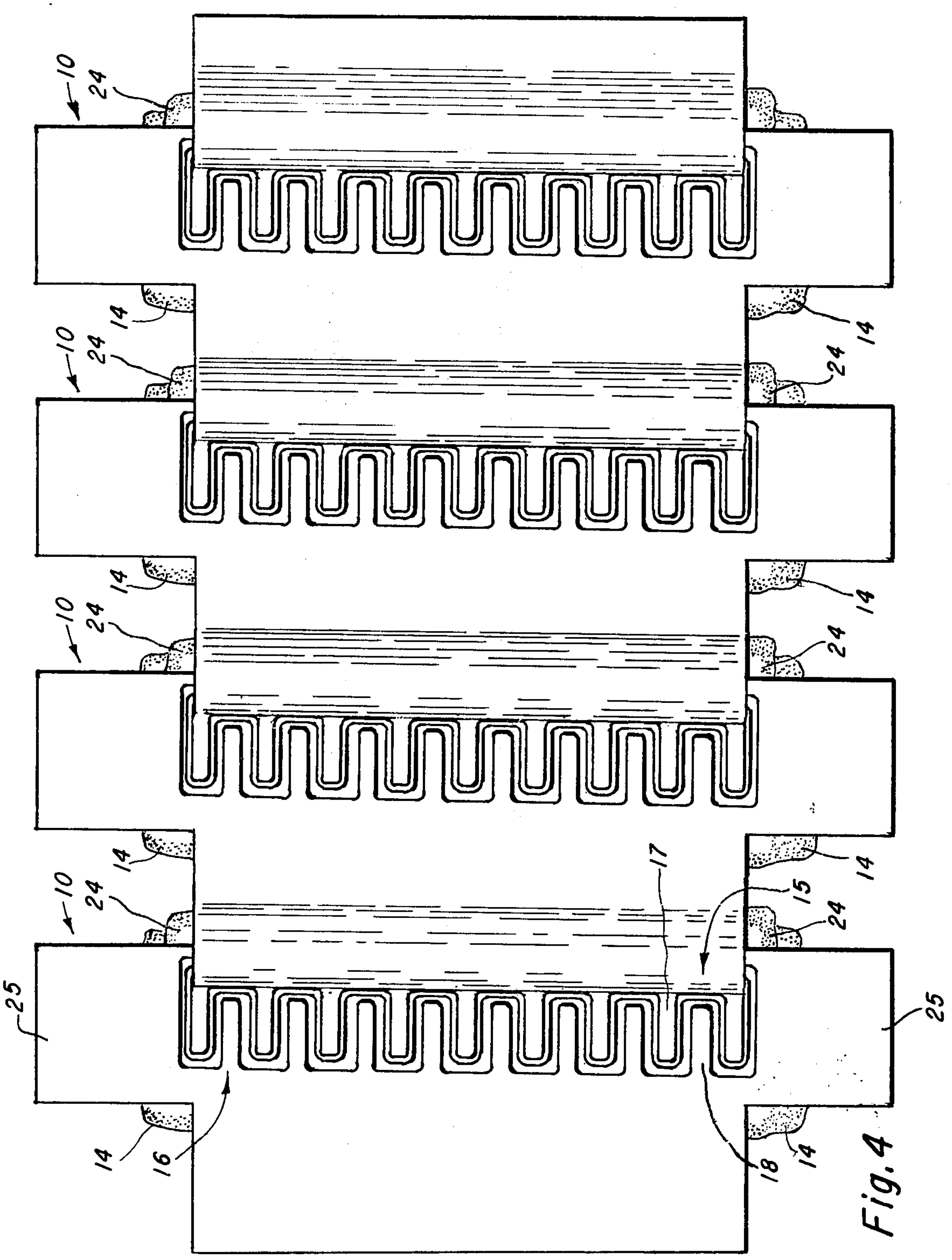
FIG. 4 is a plan view of a series diode array including a plurality of serially connected diode structures as shown in FIG. 1.

In a specific application of the semiconductor device 10 shown in FIGS. 1–3, inclusive, a plurality of such devices may be connected serially as shown in FIG. 4, wherein four such semiconductor devices 10 are serially joined. In this connection, the serially joined semiconductor devices 10 find application as a beam-leaded, monolithic series diode array for use in microwave integrated circuits, such as a frequency multiplier for microwave frequencies. The serially connected semiconductor devices comprise a high power frequency multiplier suitable for use in a phased array radar module, wherein the individual diodes exhibit small physical size and offer a high reverse breakdown voltage to handle high power with minimal electrical parasitic lead inductance and low thermal resistance to permit high power dissipation.

The respective diodes in the array are air isolated from each other to enable high breakdown voltage to be achieved of the order of 200 volts for the four serially connected diodes 10 illustrated in FIG. 4. The diodes 10 have a combined length of the order of 50 mils, and the diode array may be bonded directly onto an integrated circuit without requiring external packaging, with the expanded wing portions 25, 25 at the opposite ends of one of the electrically conductive contact members 16 for each diode 10 providing sufficient heat conduction to dissipate the heat generated at the interdigitated P-N junctions of the respective diode structures in the array. It will be observed that an electrically conductive contact member associated with one of the substrates 11 in the array may be the first contact member 15 with that substrate and then becomes the second contact member 16 associated with the next successive substrate 11 in the series array, proceeding from left to right in FIG. 4.

The beam leads employed with the series diode array in addition to holding parasitic lead inductance at a low reduced level also facilitate the fabrication of such series diode arrays with substantially uniform operating characteristics, since the performance of the beam leads from array to array is consistent to a high degree and suffers from few deviations, if any. The interdigitated arrangement of the respective P-N junctions is also responsible for a substantial reduction in the distributed resistance effect. In this connection, it is desirable to limit as much as possible the amount of semiconductor material, in this instance, silicon, in the electrical conductive path such that the electrically conductive material in the current line has the property of high conductivity. In the series diode array herein described, the metal contacts are kept in as close proximity as feasible in maintaining a substantially reduced distributed resistance effect. The reduction of parasitic inductance and resistance, among other effects, makes this device capable of extremely fast switching times of the order of 1000 pico seconds.

The present series diode array illustrated in FIG. 4 also avoids the RF resistance-skin effect prevalent in semiconductor devices where silicon is employed as the semiconductor material. This RF resistance-skin effect may be responsible for placing an upper limit of approximately 1 mil on the size of the diameter of a typical circular P-N mesa junction. The skin effect increases substantially as the diameter of a circular P-N mesa junction increases which may result in electrically isolating the center of such a mesa. The series diode array of FIG. 4 avoids this problem of RF resistance-skin effect, and within reasonable limits, is able to provide a P-N junction area of significant size such that the series diode array may operate at high breakdown voltages to enable it to handle high power.

While the invention has been described with particular reference to the embodiments thereof illustrated in the drawings, it will be understood that changes may be made in the illustrated embodiments within the spirit and scope of this invention, the only restrictions placed on the scope of this invention being those limitations recited in the claims which follow.

What is claimed is:

1. A semiconductor microwave diode device comprising:

a. a substrate of single crystal semiconductor material of one conductivity type having a resistivity in the range of from about 0.001 to about 0.003 ohm-cm., b. a plurality of elongated individual mesa areas principally of said one type conductivity material of a resistivity in excess of about 5 ohm-cm. arranged in generally parallel relationship on a major surface of said substrate, each of said mesas having an upper surface region of the opposite type conductivity semiconductor material, c. a patterned layer of protective insulating material covering said major surface of said substrate and said mesas except for a plurality of elongated areas on the top surfaces of said mesas and a plurality of elongated areas on the surface of said substrate between said mesas and a further area on the surface of said substrate interconnecting by one end said plurality of elongated areas on said substrate, d. a plurality of electrically conductive metallic layer regions overlying and adhering to said elongated areas of said substrate not covered by said protective insulation and interconnected at one end by an electrically conductive metallic web member adhering to said further area of said substrate and to said protective insulation to form a first multifingered conductive contact member, and e. a second plurality of electrically conductive metallic layer regions overlying and adhering to the tops of said mesas and interconnected at one end by an electrically conductive web member adhering to said protective insulation to form a second multifingered contact member interdigitated with said first contact member.

2. A microwave diode device as defined in claim 1 wherein said first and second contact members extend into beam leads.

3. A microwave diode device as defined in claim 1 wherein said first contact member includes respective expanded wing portions integral therewith and extending outwardly from the opposite ends thereof to aid in dissipating heat from said diode device.

4. A semiconductor diode structure comprising a plurality of semiconductor diode devices as defined in claim 2 connected in series, said series connection being effected by said plurality of diode devices being arranged in essentially a single plane and joined together in series by said beam leads which comprise single integral members electrically connecting first contact members of said diode devices to second contact members of immediately adjacent diode devices.

5. A semiconductor diode structure as defined in claim 4 wherein said first contact member of each of said diode devices includes respective expanded wing portions integral therewith and extending outwardly from the opposite ends thereof to aid in dissipating heat from said structure.

* * * * *